(12) United States Patent
Yu et al.

(10) Patent No.: US 8,118,267 B2
(45) Date of Patent: Feb. 21, 2012

(54) MOUNTING MECHANISM FOR RETAINING SLIDE RAIL TO CHASSIS

(75) Inventors: Mo-Ming Yu, Shenzhen (CN);
Guang-Hua Gu, Shenzhen (CN);
Lin-Ren Gu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 132 days.

(21) Appl. No.: 12/615,234

(22) Filed: Nov. 9, 2009

(65) Prior Publication Data

US 2011/0017895 A1    Jan. 27, 2011

(30) Foreign Application Priority Data

Jul. 24, 2009    (CN) .......................... 2009 1 0304796

(51) Int. Cl.
*G12B 9/00*    (2006.01)
(52) U.S. Cl. ................... 248/27.3; 248/222.11
(58) Field of Classification Search ............ 248/27.1, 248/27.3, 221.11, 222.14, 544, 222.11, 222.52, 248/225.11, 292.13, 291.1; 312/333, 334.7, 312/334.46, 334.44, 334.47
See application file for complete search history.

(56) References Cited

U.S. PATENT DOCUMENTS

| | | | |
|---|---|---|---|
| 6,209,979 B1 * | 4/2001 | Fall et al. | 312/330.1 |
| 6,601,933 B1 * | 8/2003 | Greenwald | 312/333 |
| 2004/0108797 A1 * | 6/2004 | Chen et al. | 312/334.7 |
| 2007/0114895 A1 * | 5/2007 | Chen et al. | 312/333 |
| 2009/0310894 A1 * | 12/2009 | Yu et al. | 384/21 |

* cited by examiner

*Primary Examiner* — Terrell McKinnon
*Assistant Examiner* — Eret McNichols
(74) *Attorney, Agent, or Firm* — Altis Law Group, Inc.

(57) ABSTRACT

A mounting mechanism is disclosed. The mounting mechanism includes a chassis with an anchor member, a slide rail defining a mounting slot to receive the anchor member, and a retaining member slidably attached to the slide rail. A first end of the retaining member is pivotable attached to the slide rail. The retaining member comprises a stop surface and an inclined surface opposite to the stop surface formed from a second end of the retaining member. The anchor member slides in the mounting slot to drive the inclined surface of the retaining member to rotate the retaining member, when the anchor member rides over the stop portion, the retaining member is restored to make the stop surface of the stop portion retain the anchor member in the mounting slot of the slide rail.

8 Claims, 5 Drawing Sheets

MOUNTING MECHANISM FOR RETAINING SLIDE RAIL TO CHASSIS

CROSS-REFERENCE TO RELATED APPLICATION

The relevant subject matter is disclosed in co-pending U.S. application Ser. No. 12/615,231 and application Ser. No. 12/615,236) filed on the same date Nov. 9, 2009 and entitled "MOUNTING MECHANISM FOR RETAINING SLIDE RAIL TO CHASSIS", which are assigned to the same assignee as this patent application.

BACKGROUND

1. Technical Field

The present disclosure relates to mounting mechanisms, and more particularly to a mounting mechanism for mounting a slide rail to a chassis.

2. Description of Related Art

A typical slide rail assembly for a server chassis and a rack includes an outer slide rail mounted to the rack, an inner slide rail mounted to the chassis, and an intermediate slide rail mounted between the outer and inner slide rails. The intermediate slide rail is extendable relative to the outer slide rail, and the inner slide rail is extendable relative to the intermediate slide rail, thereby the chassis can be extended a distance out from the rack. Conventionally, the inner rail is secured to a side of the chassis with a plurality of screws. Therefore, a tool, such as a screwdriver, is needed for installing and detaching the slide rail, and the processes are tedious and time consuming.

DETAILED DESCRIPTION

Figure 1:
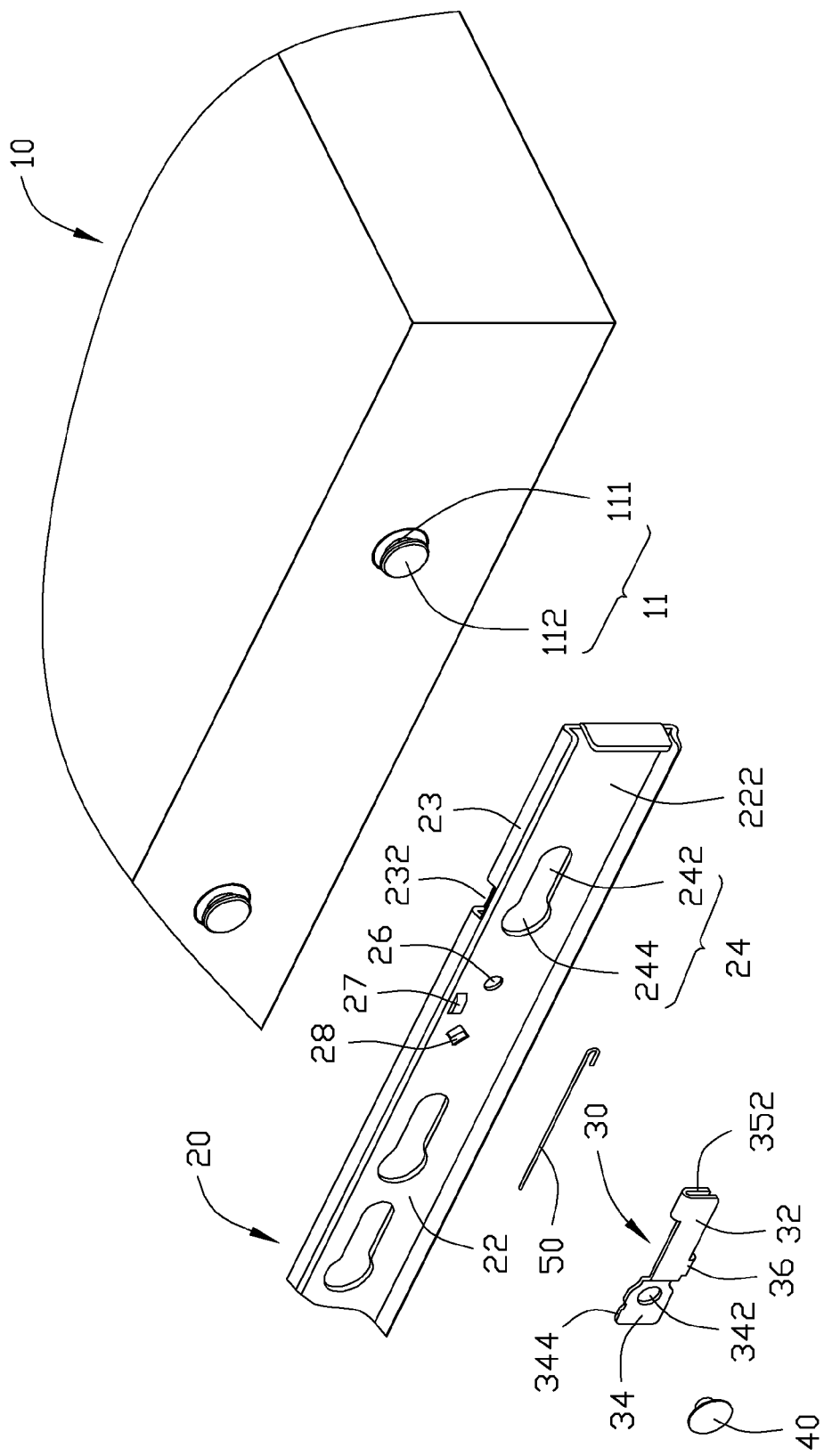
FIG. 1 is a partial, exploded, isometric view of an exemplary embodiment of a mounting mechanism, the mounting mechanism includes a retaining member.

Referring to FIG. 1, an exemplary embodiment of a mounting mechanism includes a chassis 10, a slide rail 20, a retaining member 30 coupled to the slide rail 20, a resilient member 50 arranged between the retaining member 30 and the slide rail 20, and a fastener 40 such as a rivet.

The chassis 10 includes an anchor member 11 mounted to a sidewall of the chassis 10. The anchor member 11 is a mushroom-shaped post, and includes a neck portion 111 and a head portion 112 wider in diameter than the neck portion 111.

The slide rail 20 has a generally C-shaped cross-section, and includes a main wall 22 with a first surface 222 opposite to the chassis 10 and two sidewalls 23 extending from opposite sides of the main wall 22 opposite to the chassis 10. The main wall 22 defines a mounting slot 24, in the vicinity of one end of the main wall 22. The mounting slot 24 includes a positioning portion 242, and a guiding portion 244 communicating with the positioning portion 242 and having a larger dimension than the positioning portion 242. A coupling hole 26 is defined in the main wall 22, in the vicinity of the mounting slot 24. A bulge 27 is formed extending from the first surface 222 of the main wall 22, adjacent to the coupling hole 26 and away from the mounting slot 24. A tab 28 extends from the first surface 222 of the main wall 22, adjacent to the bulge 27. A cutout 232 is defined in an upper sidewall 23, aligned with the guiding portion 244.

Figure 2:
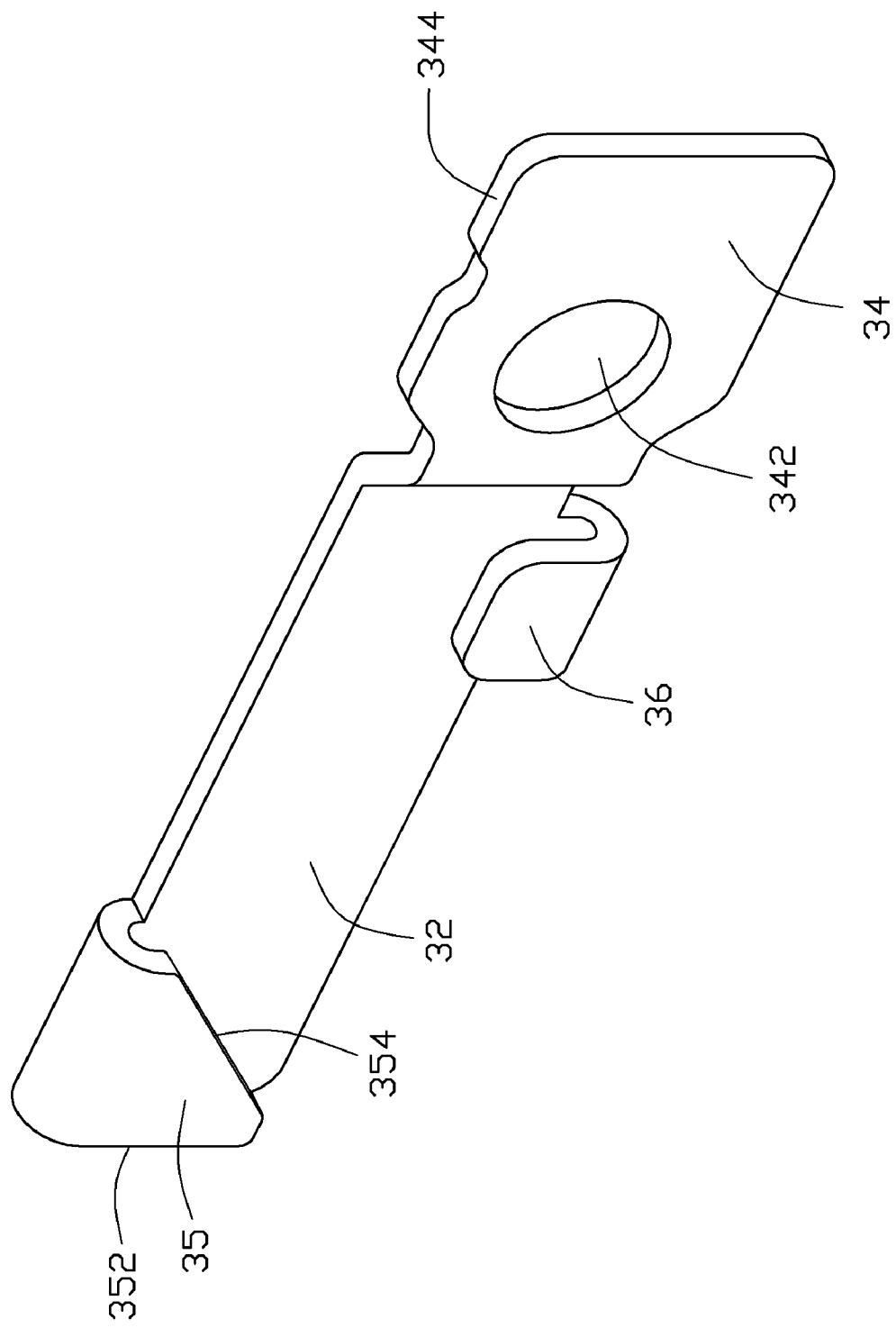
FIG. 2 is an enlarged view of the retaining member of FIG. 1, but viewed from another perspective.

Referring to FIG. 2, the retaining member 30 is integrally formed with a resilient piece, and includes a main body 32, a pivot portion 34 extending from a first end of the main body 32, a stop portion 35 extending from a second end of the main body 32 opposite to the pivot portion 34, and a bent portion 36 extending from a bottom of the main body 32. A through hole 342 is defined in the pivot portion 34. A limiting section 344 is formed on a top of the pivot portion 34. The stop portion 35 is formed by bending a piece extending from an upper portion of the second end of the main body 32 to be parallel to the main body 32. The stop portion 35 includes a stop surface 352 and an inclined surface 354 formed from opposite sides of the stop portion 35. The main body 32 is raised from the pivot portion 34 and the stop portion 35.

The resilient member 50 is integrally formed with a resilient metal wire, and includes a clip formed at a first end of the resilient member 50.

Figure 3:
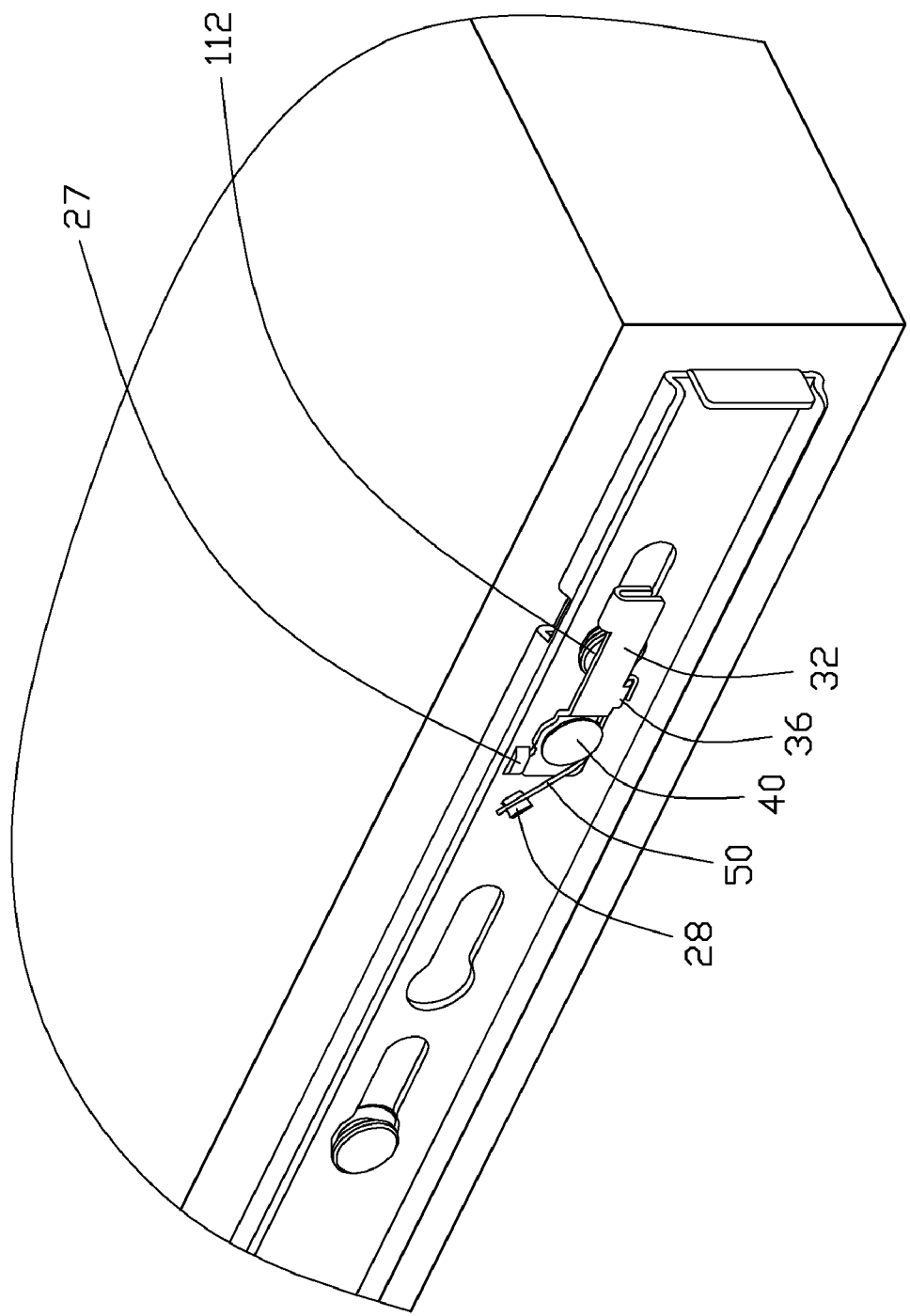
FIGS. 3-5 are assembled, isometric views of the mounting mechanism of FIG. 1, showing different using states.

Referring to FIG. 3, in assembly, the fastener 40 pivotably extends through the through hole 342 of the retaining member 30 to engage in the coupling hole 26 of the slide rail 20, thereby pivotably attaching the retaining member 30 to the slide rail 20. The stop portion 35 of the retaining member 30 is aligned with the guiding portion 244 of the mounting slot 24 of the slide rail 20. The clip of the resilient member 50 is locked to the bent portion 36 of the retaining member 30. A second end of the resilient member 50 rides over the fastener 40 to be blocked to the tab 28 of the slide rail 20. The limiting section 344 of the retaining member 30 engages with the bulge 27 of the slide rail 20. The pivot portion 34 and the stop portion 35 are in tight contact with the first surface 222 of the slide rail 20. The main body 32 is spaced by a distance from the first surface 222 of the slide rail 20.

Figure 4:
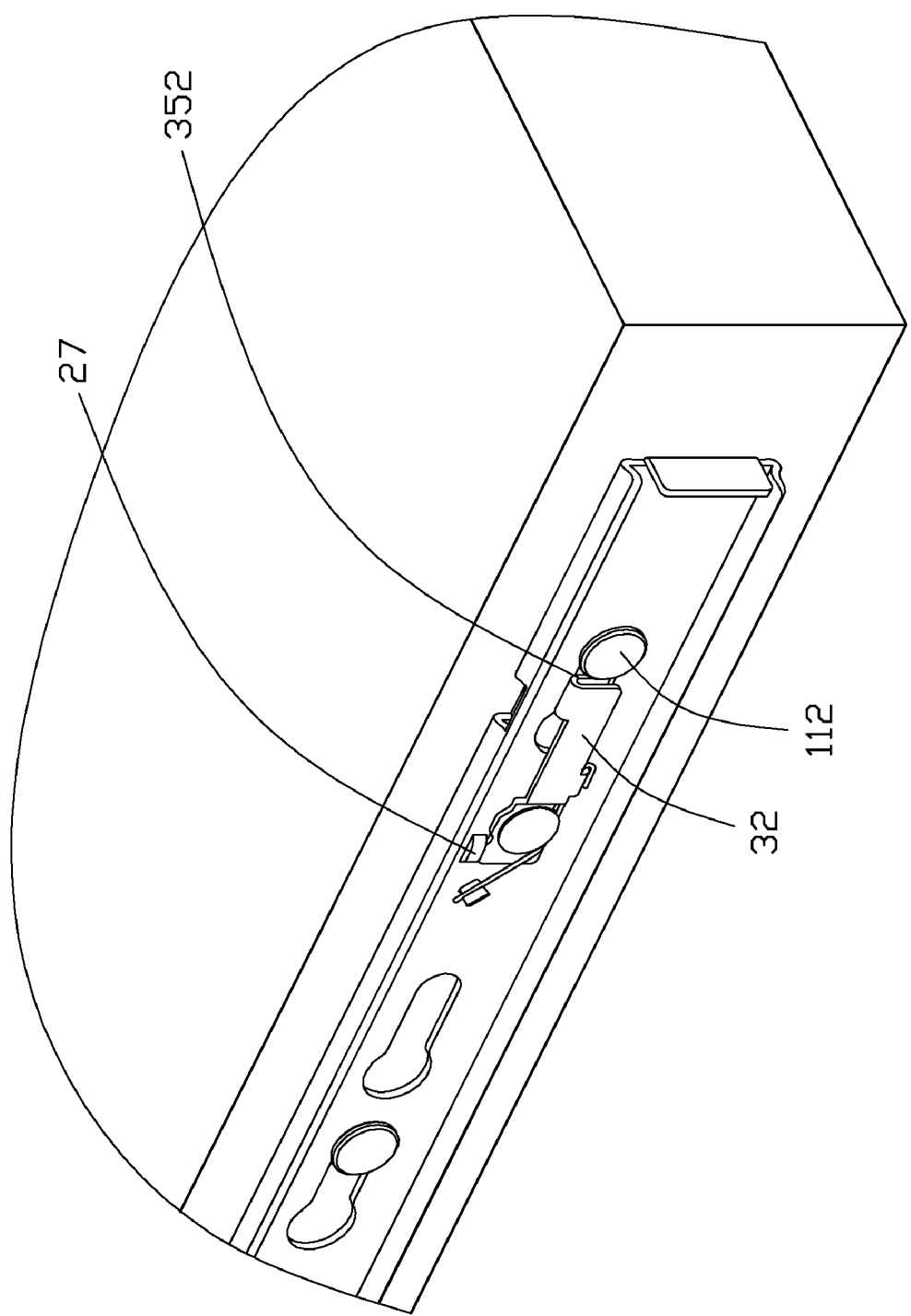

Referring to FIG. 4, to mount the slide rail 20 to the chassis 10, the chassis 10 is moved to fit the neck portion 111 of the anchor member 11 into the mounting slot 24 from the guiding portion 244 to the position portion 242. The head portion 112 of the anchor member 11 presses the inclined surface 354 of the stop portion 35 of the retaining member 30 to rotate the retaining member 30 upward around the fastener 40 in a direction parallel to the first surface 222 of the slide rail 20. When the neck portion 111 of the anchor member 11 slides into the positioning portion 242 of the mounting slot 24, the resilient member 50 is restored to rotate the retaining member 30 downward to make the stop surface 352 of the stop portion 35 engage with the head portion 112 of the anchor member 11, to retain the anchor member 11 in the positioning portion 242 of the mounting slot 24. The limiting section 344 of the retaining member 30 engages with the bulge 27 of the slide rail 20 to limit the retaining member 30 from further rotating downward. Therefore, the slide rail 20 is secured to the chassis 10. The cutout 232 of the slide rail 20 is used for avoiding the upper sidewall 23 interfering with the stop portion 35 of the retaining member 30, when the retaining member 30 rotating.

Figure 5:
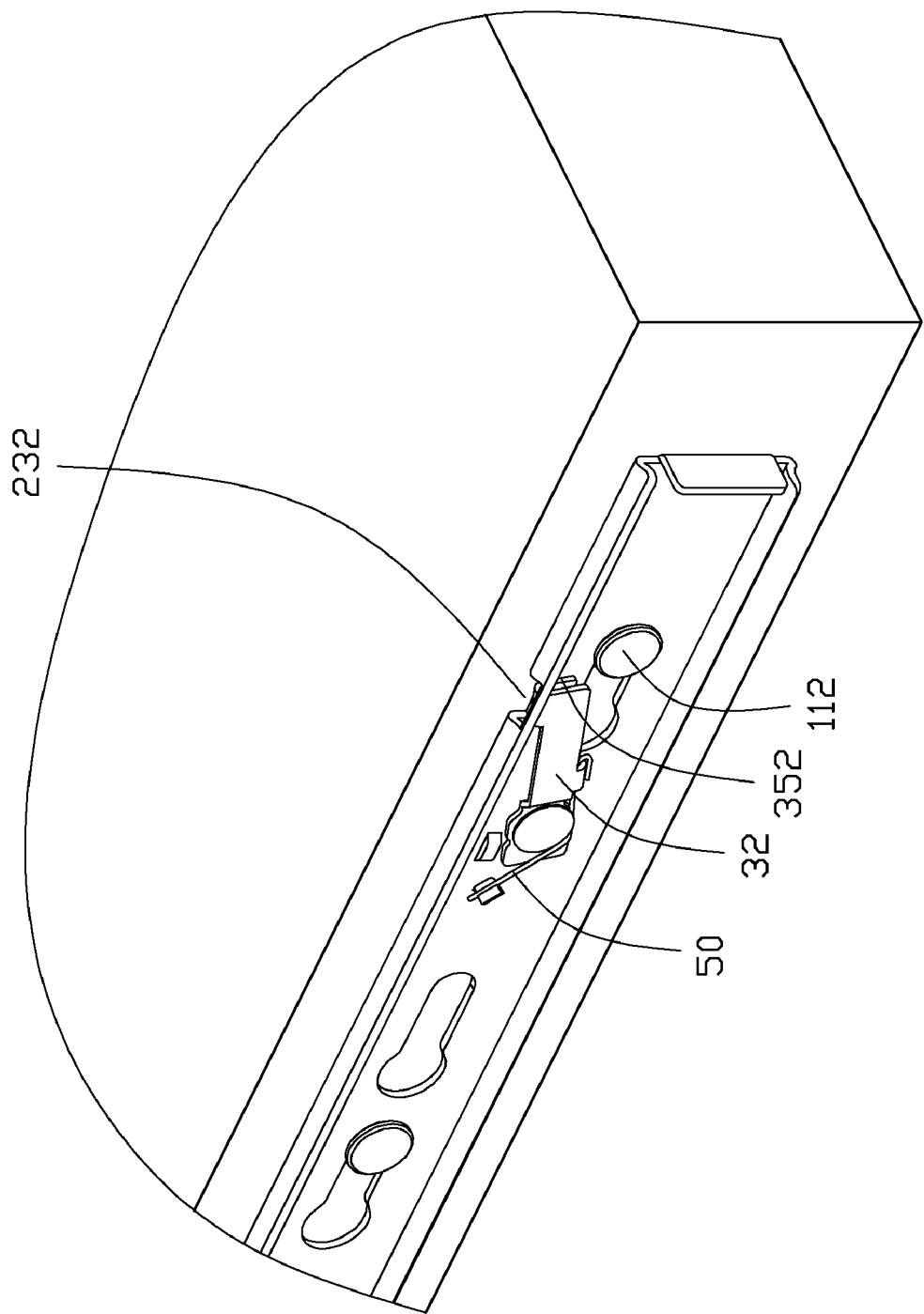

Referring to FIG. 5, to detach the slide rail 20 from the chassis 10, the retaining member 30 is rotated upward around the fastener 40 in a direction parallel to the first surface 222 of the slide rail 20, such that the stop surface 352 of the stop portion 35 is disengaged from the head portion 112 of the anchor member 11. The chassis 10 is moved to allow the neck portion 111 of the anchor member 11 to slide out of the positioning portion 242 of the mounting slot 24, and then slide out of the guiding portion 244 of the mounting slot 24. Thereby, the slide rail 20 is detached from the chassis 10.

While several embodiments have been disclosed, it is understood that any element disclosed in any one embodiment is easily adapted to other embodiments. It is also to be understood, however, that even though numerous characteristics and advantages of the disclosure have been set forth in the foregoing description, together with details of the structure and function of the invention, the disclosure is illustrative only, and changes may be made in details, especially in matters of shape, size, and arrangement of parts within the principles of the invention to the full extent indicated by the broad general meaning of the terms in which the appended claims are expressed.

What is claimed is:

1. A mounting mechanism comprising:
   a chassis comprising an anchor member fixed to the chassis;
   a slide rail defining a mounting slot for receiving the anchor member of the chassis; and
   a retaining member comprising a main body, a pivot portion extending from a first end of the main body, a stop portion extending from a second end of the main body opposite to the pivot portion, wherein the pivot portion is pivotably attached to the slide rail, the main body is raised from the pivot portion and the stop portion, the pivot portion and the stop portion are in tight contact with the slide rail, the main body is spaced by a distance from the slide rail, the stop portion comprises a stop surface and an inclined surface opposite to the stop surface;
   wherein the anchor member slides in the mounting slot to drive the inclined surface of the retaining member to rotate the retaining member to an upper position to allow the anchor member to ride over the stop portion, and when the anchor member rides over the stop portion, the retaining member is biased to rotate to a lower position to retain the anchor member in the mounting slot of the slide rail; and
   wherein the stop portion is formed by bending a piece extending from an upper portion of the second end of the main body to be parallel to the main body.

2. The mounting mechanism of claim 1, wherein the anchor member is a mushroom-shaped post, and comprises a neck portion and a head portion with a diameter larger than a diameter of the neck portion, the neck portion of the anchor member is slidable in the mounting slot of the slide rail, the head portion of the anchor member is engagable with the stop portion of the retaining member.

3. The mounting mechanism of claim 2, wherein the mounting slot comprises a guiding portion for the anchor member entering into the mounting slot, and a positioning portion for engaging the neck portion of the anchor member.

4. The mounting mechanism of claim 1, wherein the retaining member is made of an integrative resilient piece.

5. The mounting mechanism of claim 1, further comprising a resilient member arranged between the retaining member and the slide rail, to restore the retaining member.

6. The mounting mechanism of claim 5, wherein a bent portion extends from a bottom of the main body for locking a first end of the resilient member, a tab extends from the slide rail, for blocking a second end of the resilient member.

7. The mounting mechanism of claim 1, wherein a limiting section is formed from a top of the pivot portion of the retaining member, a bulge extends from the slide rail for engaging with the limiting section, to limit the retaining member from further rotating.

8. The mounting mechanism of claim 1, wherein the slide rail comprises a main wall and two sidewalls extending from opposite sides of the main wall, a cutout is defined in an upper sidewall of the sidewalls, for avoiding the upper sidewall interfering with the stop portion of the retaining member when the retaining member rotating.

* * * * *